(12) United States Patent
Nakajima et al.

(10) Patent No.: US 10,185,233 B2
(45) Date of Patent: Jan. 22, 2019

(54) COVER MEMBER, CONVEYING APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Kazunori Nakajima, Tokyo (JP); Shigeo Koya, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/477,894

(22) Filed: Apr. 3, 2017

(65) Prior Publication Data

US 2017/0285494 A1     Oct. 5, 2017

(30) Foreign Application Priority Data

Apr. 5, 2016   (JP) .................. 2016-075990

(51) Int. Cl.
*G03F 7/20*    (2006.01)
*G03F 7/00*    (2006.01)
*H01L 21/677*  (2006.01)

(52) U.S. Cl.
CPC ........ *G03F 7/70925* (2013.01); *G03F 7/0002* (2013.01); *G03F 7/707* (2013.01); *H01L 21/67748* (2013.01)

(58) Field of Classification Search
CPC .. G03F 7/707; G03F 7/70341; G03F 7/70925; G03F 7/7002; G03F 7/70733
USPC .................................... 355/30, 72–76
See application file for complete search history.

(56) References Cited

U.S. PATENT DOCUMENTS

| | | | |
|---|---|---|---|
| 4,718,141 A * | 1/1988 | Kuehnl ............ | A47L 4/02 15/220.3 |
| 6,392,738 B1 * | 5/2002 | van de Pasch ...... | G03F 7/707 355/30 |
| 8,810,777 B2 * | 8/2014 | Cadee ............ | B24B 31/112 355/53 |
| 9,575,420 B2 * | 2/2017 | Kasai ............ | G03F 7/70925 |
| 2002/0021435 A1 * | 2/2002 | Yamada .......... | G03F 7/70741 355/72 |

FOREIGN PATENT DOCUMENTS

JP        2004-207399 A        7/2004

* cited by examiner

*Primary Examiner* — Hung Nguyen
(74) *Attorney, Agent, or Firm* — Canon U.S.A., Inc. IP Division

(57) ABSTRACT

A cover member that covers a first surface on an opposite side with respect to a holding surface of a holding portion that holds a substrate, the cover member including a first removing member that removes a foreign substance attached to the first surface, in which the cover member is capable of being fixed to the holding portion while the first surface and the first removing member are in contact with each other covering the first surface.

12 Claims, 4 Drawing Sheets

COVER MEMBER, CONVEYING APPARATUS, LITHOGRAPHY APPARATUS, AND METHOD OF MANUFACTURING ARTICLE

BACKGROUND OF THE INVENTION

Field of the Invention

The present disclosure relates to a cover member, a conveying apparatus, a lithography apparatus, and a method of manufacturing an article.

Description of the Related Art

In recent years, with an aim to improve productivity of devices, such as semiconductor devices and liquid crystal display devices, a high throughput is required in lithography devices used in manufacturing such devices. Due to the above, increase in acceleration speed of a stage used in lithography apparatuses is in progress. Note that examples of a lithography apparatus include an exposure apparatus, an imprint apparatus, and an electron beam lithography system. It is effective to reduce the weight of the stage in order to increase the acceleration speed of the stage, and a reduction in weight of a chuck that holds a substrate on the stage is also required.

Furthermore, in order to correspond to highly integrated and miniaturized devices, for example, an increase in NA in exposure apparatuses is in progress. With an increase in NA, although the resolving power improves, since the effective focal depth decreases upon the increase in NA, the exposure apparatus is required to hold the substrate so that the substrate have high flatness.

Japanese Patent Laid-Open No. 2004-207399 discloses a substrate holding apparatus that removes foreign substances in the contact portion between a chuck and a stage by relatively moving the chuck and the stage with respect to each other while having the chuck and the stage holding the chuck be in contact with each other.

Japanese Patent Laid-Open No. 2004-207399 discloses a chuck that includes, on a back surface thereof, projections and recesses that remove foreign substances in the contact portion of the chuck and the stage.

However, if a further reduction in weight of the chuck is carried out while a further increase in the acceleration speed of the stage is carried out, warping may occur in the chuck since the projections and recesses are only provided on the back surface of the chuck. Furthermore, if a further reduction in weight of the chuck is carried out, warping may occur while the chuck is conveyed. Accordingly, disadvantageously, a high flatness of the substrate held by the chuck cannot be maintained.

SUMMARY OF THE INVENTION

The present disclosure provides a cover member, a conveying apparatus, a lithography apparatus, and a method of manufacturing an article that hold a substrate while maintaining a high flatness of the substrate.

A cover member that is an aspect of the present disclosure is a cover member that covers a first surface on an opposite side with respect to a holding surface of a holding portion that holds a substrate, the cover member including a first removing member that removes a foreign substance attached to the first surface, in which the cover member is capable of being fixed to the holding portion while the first surface and the first removing member are in contact with each other covering the first surface.

Further features of the present disclosure will become apparent from the following description of exemplary embodiments with reference to the attached drawings.

DESCRIPTION OF THE EMBODIMENTS

Description of the Preferred Embodiments

Figure 1:
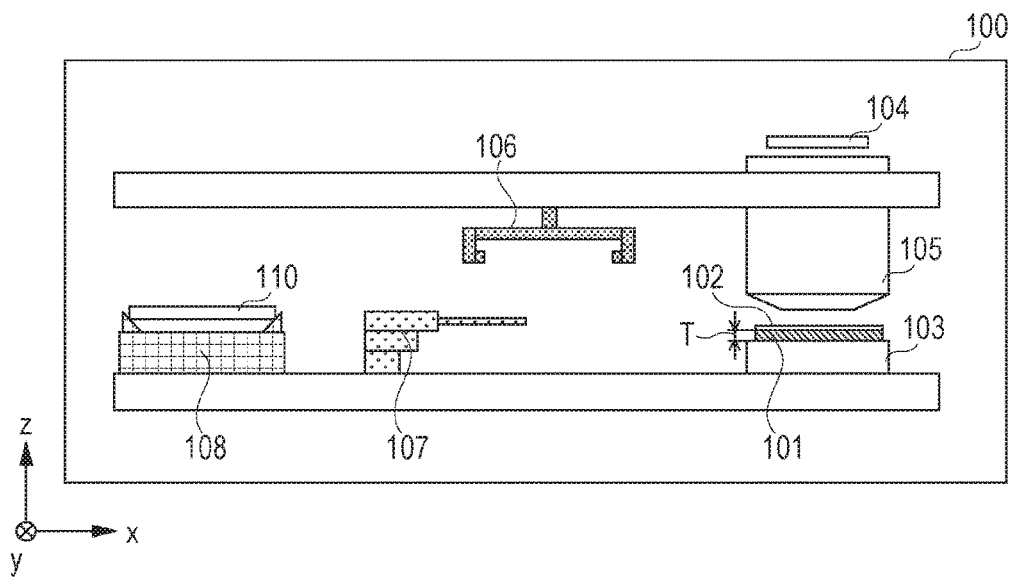
FIG. 1 is a diagram schematically exemplifying an entirety of an exposure apparatus.

Hereinafter, preferred exemplary embodiments of the present disclosure will be described in detail with reference to the drawings. In the exemplary embodiments below, examples in which an exposure apparatus is used as a lithography apparatus will be described. In each drawing, the same members will be attached with the same reference numerals and redundant description thereof will be omitted.

First Exemplary Embodiment

A description of a cover member according to a first exemplary embodiment will be given next. FIG. 1 is a diagram schematically exemplifying an entirety of an exposure apparatus 100. In the exposure apparatus 100, a reticle (an original or a mask) 104 is irradiated by exposure light from a light source (not shown), which has been guided through an illumination optical system. A wafer 102 (a substrate) is irradiated by the exposure light that has passed through the reticle 104 and that has passed through an optical projecting system in a lens barrel 105. A chuck 101 (a holding portion) including a holding surface that holds the wafer 102 is held by a chuck holding surface of a movable stage 103 (a moving unit).

Various forms of chucks may be used as the chuck 101 such as, for example, a vacuum chuck such as a chuck (a pin chuck) provided with a plurality of pins (protrusions) or a porous chuck formed of a porous member, or an electrostatic chuck provided with electrodes. Furthermore, the size of the surface of the chuck 101 in an XY direction may be any size that is large enough to hold the wafer 102 having a diameter of, for example, 300 mm or 450 mm. Accordingly, the size of the surface of the chuck 101 that holds the wafer 102 may be, a size that covers, for example, a circle with a diameter ranging from 300 mm to 310 mm, or from 450 mm to 460 mm. Furthermore, desirably, the weight of the chuck 101 is reduced by reducing a thickness T (a dimension in a Z direction) of the chuck 101 as much as possible while obtaining sufficient strength and rigidity to hold the wafer 102. Ceramics such as, for example, alumina ($Al_2O_3$), silicon carbide (SiC), silicon nitride ($Si_3N_6$), or zircon ($ZrSiO_4$) may be used as the material of the chuck 101. In such a case, the thickness T ranging from 1 mm to 3 mm satisfies the above requirements. In other words, in a case in which the thickness is larger than the upper limit of the range described above, a sufficient reduction in weight cannot be made, and in a case in which the thickness T is smaller than the lower limit of the range described above, sufficient strength and rigidity to hold the wafer 102 cannot be obtained. Furthermore, the chuck 101 held by the stage 103 may be detached from the stage 103 by releasing the chuck 101 held by the stage 103. Furthermore, a plurality of suction pins (not shown) that supports the wafer 102 are included in the stage 103. Furthermore, the chuck 101 includes holes (not shown) through which the plurality of suction pins pass. The suction pins protrude upwards from the surface of the chuck 101 by moving the suction pins upwards (+Z direction) or by moving the stage 103 downwards (−Z direction) before a hand of a conveying mechanism 107 described later carries the wafer 102 into the chuck 101. Subsequently, the hand conveys the wafer 102 onto tips of the suction pins. In the above, a gap allowing the hand to move therein is formed between the chuck 101 and the wafer 102. Subsequently, the wafer 102 is mounted on the chuck 101 by moving the suction pins downwards, or moving the stage 103 upwards after withdrawing the hand from the gap. Note that the suction pins or the stage 103 is moved in a similar manner when the wafer 102 is carried out from the chuck 101.

An attaching and detaching mechanism 106 (an attaching and detaching portion) attaches and detaches the chuck 101 to and from the stated 103. The attaching and detaching mechanism 106 holds the chuck 101 that has been released from being held on the stage 103, is driven in the +Z direction so as to dismount the chuck 101 from the stage 103, and moves the chuck 101 in the direction. Furthermore, from a state in which the chuck 101 is held in the +Z direction of the stage 103, by driving the attaching and detaching mechanism. 106 in the −Z direction, the chuck 101 is moved in the −Z direction and the chuck. 101 is attached to the stage 103.

The conveying mechanism 107 (a conveying portion) conveys the chuck 101 and a cover 110 between a maintenance table 108 and the stage 103 while the chuck 101 is fixed to the cover (cover member) 110 described later. Furthermore, the conveying mechanism 107 is also capable of conveying the cover 110 alone between the maintenance table 108 and the stage 103. The maintenance table 108 is capable of mounting the chuck 101, the cover 110, or the chuck 101 and the cover 110.

Figure 2A:
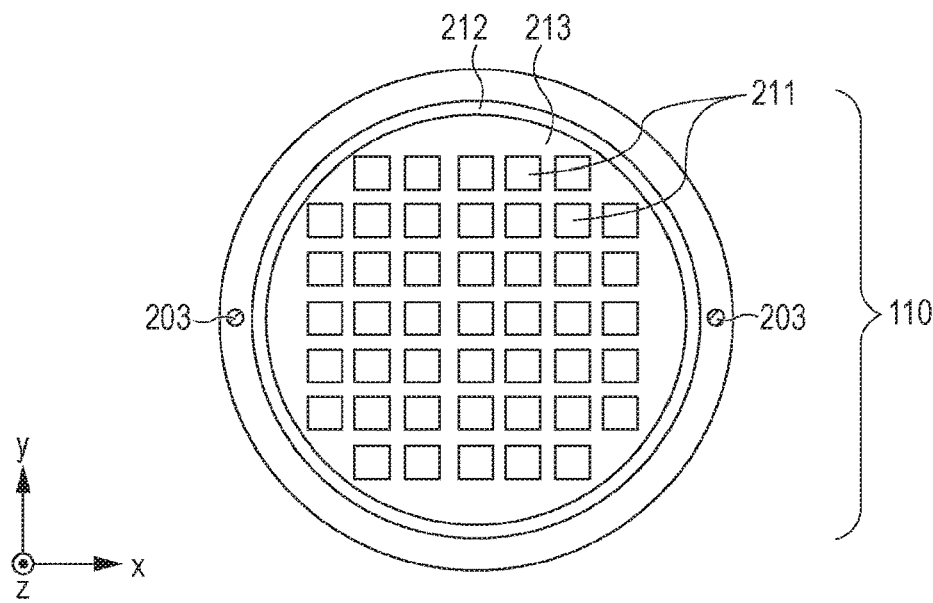
FIGS. 2A to 2C are diagrams exemplifying a cover and the like according to a first exemplary embodiment.
Figure 2B:
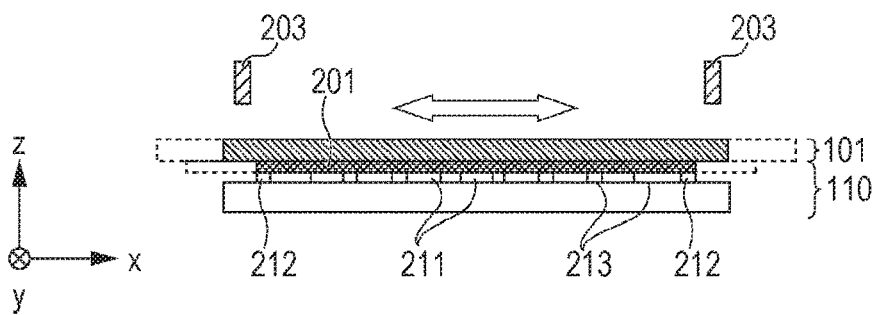
Figure 2C:
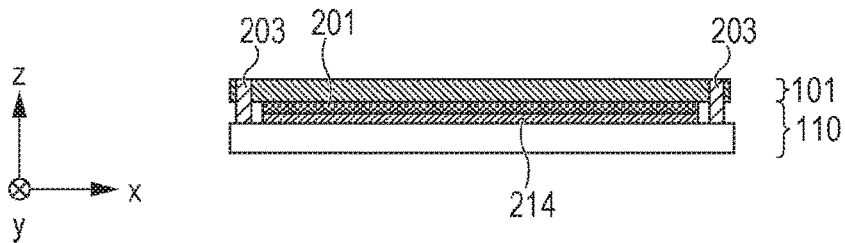

FIGS. 2A to 2C are diagrams exemplifying the cover and the like according to the first exemplary embodiment. The cover 110 according to the present exemplary embodiment will be described with reference to FIGS. 2A, 2B, and 2C. The cover 110 is capable of fixing the chuck 101 while covering the back surface of the chuck 101. A foreign substance may become attached to the back surface of the chuck. 101 while the chuck 101 is conveyed. In particular, in a case in which the wafer 102 and the chuck 101 become further large, the possibility of the above becomes higher. Accordingly, it is important to avoid foreign substances from becoming attached to the back surface of the chuck 101 by covering the back surface of the chuck 101 with the cover 110. Note that the surface of the chuck 101 that holds the wafer 102 is referred to as a front surface of the chuck 101, and the surface of the chuck 101 on the side opposite to the front surface of the chuck 101 is referred to as a back surface. Furthermore, the surface of the cover 110 that fixes the chuck 101 is referred to as a front surface of the cover 110, and the surface of the cover 110 on the side opposite to the front surface of the cover 110 is referred to as a back surface of the cover 110. The cover 110 fixes the chuck 101 while the front surface of the cover 110 covers the back surface of the chuck 101. Accordingly, the size of the front surface of the cover 110 may be any size that is equivalent to or larger than the size of the back surface of the chuck 101. Furthermore, in a case in which a contact portion 201 that, is a portion of the chuck 101 in contact with the stage 103 is provided on the back surface of the chuck 101, the size of the front surface of the cover 110 may be any size that is equivalent to or larger than the size of the surface of the contact portion 201 in contact with the cover. Ceramics such as, for example, alumina ($Al_2O_3$), silicon carbide (SiC), silicon nitride ($Si_3N_4$), or zircon ($ZrSiO_6$) may be used as the material of the cover 110.

In the example illustrated in FIGS. 2B and 2C, the front surface and the back surface of the chuck 101 have a flat surface shape. However, not limited to the above, the front surface and the back surface of the chuck 101 may have a structure including a plurality of projections, a structure including ring-shaped protrusions, or a grid-like rib structure, as long as the front surface and the back surface of the chuck 101 have the same shape. Herein, a case in which the difference in shape between the front surface and the back surface of the chuck 101 is large such as, for example, a case in which the front surface of the chuck 101 has a structure including a plurality of projections and the back surface of the chuck 101 has a structure including ring-shaped protrusions will be considered. In a case in which the weight of such a chuck 101 is reduced, warping may occur in the chuck. 101 when, for example, manufacturing the chuck 101. As a result, a problem may occur in which the wafer 102 cannot be held by the chuck 101 while a high flatness of the wager 102 is maintained. Accordingly, by forming the front surface and the back surface of the chuck 101 to have similar shapes, warping in the chuck 101 can be prevented from occurring even in a case in which the weight of the chuck 101 is reduced.

At least two fixing members 203 are included in the cover 110 so that the chuck 101 does not become displaced or becomes detached and drops from the cover 110. By having the fixing members 203 each include a screw thread near the end portion. In contact with the cover 110 and by having the cover 110 include screw holes, the fixing members 203 are detachable from the cover 110. The fixing members 203 have, for example, a cylindrical or a prismatic shape, and fix the chuck 101 in a direction extending along the front surface of the cover 110. Accordingly, the chuck 101 includes, for example, a hole or a cut-out that the fixing members 203 passes for fixing the chuck 101 to the cover 110. Furthermore, since the fixing members 203 do not fix the chuck 101 in the Z direction, the chuck 101 fixed to the cover 110 can be moved in the +Z direction and be dismounted. Furthermore, the chuck 101 can be moved in the −Z direction and be fixed to the cover 110.

Furthermore, at least one protrusion 211 and at least one recess 213, serving as a removing member (a first removing member), are included in the front surface of the cover 110 so as to remove the foreign substance attached to the back surface of the chuck 101. The shape of the protrusion 211 may be, not only a square illustrated in FIG. 2A, any shape such as a circle, an ellipse, a polygon, or a grid-like shape. Furthermore, at least one annual protrusion 212 may be included. The annular protrusion 212 illustrated in FIG. 2A is a single annular protrusion 212 disposed around the protrusions 211; however, a plurality of annular protrusions with different diameters may be disposed, and annular protrusions may be disposed between the plurality of protrusions 211.

Referring next to FIG. 2B, a method of removing a foreign substance of the chuck 101 with the cover 110 of the present exemplary embodiment will be described. While having the plurality of protrusions 211 and the annular protrusion 212 be in contact with the back surface of the chuck 101, the cover 110 and the chuck 101 are slid against each other in a direction extending along the contact surfaces. By sliding the cover 110 and the chuck 101, the foreign substance attached to the back surface of the chuck 101 is made to fall into the recesses 213 of the cover 110. In the above, sliding is performed while in a state in which the fixing members 203 are dismounted from the cover 110. Furthermore, by covering the back surface of the chuck 101 with the annular protrusion 212, entering of foreign substance between the back surface of the chuck 101 and the cover 110 can be prevented after the cover 110 is mounted on the chuck 101. In a state in which the foreign substance on the back surface of the chuck 101 has been removed, by mounting the cover 110 on the chuck 101 and attaching the fixing members 203, conveying onto the stage 103 can be performed while there is no foreign substance on the back surface of the chuck 101. As a result, interposing of a foreign substance between the chuck 101 and the stage 103 can be prevented. Note that the sliding of the cover 110 and the chuck 101 are performed beforehand outside the exposure apparatus 100.

Furthermore, in a case of a structure in which the plurality of projections is included on the back surface of the chuck 101, the cover 110 and the chuck 101 are slid against each other while having the plurality of protrusions 211 and the annular protrusion 212, and the plurality of projections be in contact with each other. Furthermore, in a case of a structure in which the ring-shaped protrusions are included on the back surface of the chuck 101, the cover 110 and the chuck 101 are slid against each other while having the plurality of protrusions 211 and the annular protrusion 212, and the ring-shaped protrusions be in contact with each other. Furthermore, in a case of a structure in which the grid-like rib is included on the back surface of the chuck 101, the cover 110 and the chuck 101 are slid against each other while having the plurality of protrusions 211 and the annular protrusion 212, and the grid-like rib be in contact with each other.

The heights from the recesses 213 to the protrusions 211, and from the recesses 213 to the annular protrusion 212 may be sufficiently high compared with the height of the foreign substance that has dropped into the recess 213. The width and the pitch of the protrusions 211 and the width of the annular protrusion 212 may have dimensions allowing the plurality of protrusions 211 and the end portion of the annular protrusion 212 to stroke the entire area of the back surface of the chuck 101 when sliding is performed. Furthermore, while a method of removing foreign substances by sliding of the protrusion 211 of the cover 110 and the like has been described, as illustrated in FIG. 2C, an adhesive 214 serving as a removing member for removing foreign substances attached to the back surface of the chuck 101 may be included on the front surface of the cover 110. Foreign substances can be removed by having the adhesive 214 come into contact with and become separated from the back surface of the chuck 101. Furthermore, the size of the surface constituting the adhesive 214 may be any size that is larger than the entire surface of the back surface of the chuck 101 so as to remove foreign substances from the entire back surface of the chuck. 101.

Figure 3:
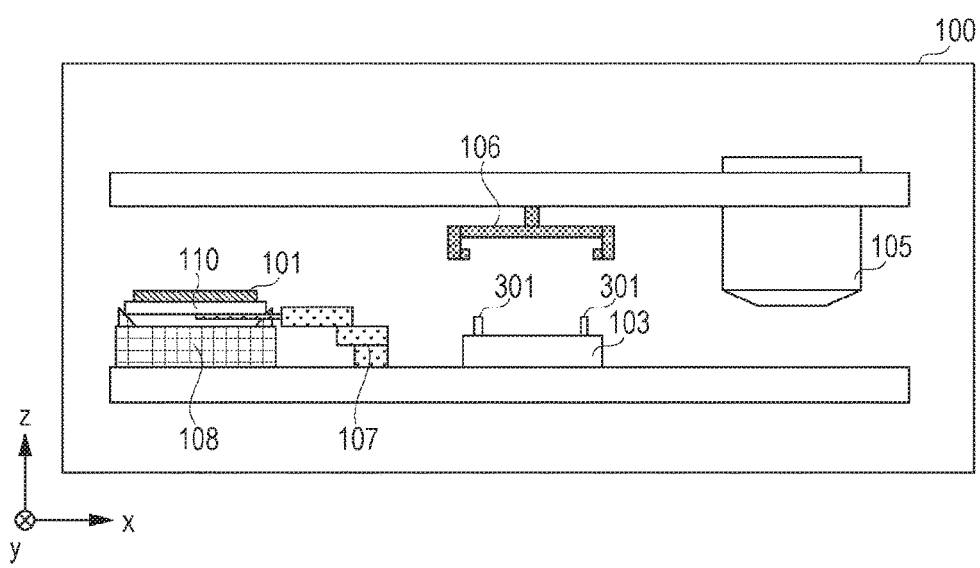
FIG. 3 is a diagram exemplifying an exposure apparatus that conveys the chuck and the cover.

FIG. 3 is a diagram exemplifying an exposure apparatus that conveys the chuck and the cover. A method for carrying the chuck 101 in the stage 103 and carrying the chuck 101 out of the stage 103, while the chuck 101 and the cover 110 are in an integral state will be described. The chuck 101 and the cover 110 that are integral to each other are, first, mounted on the maintenance table 108 inside the exposure apparatus 100. Subsequently, the chuck. 101 and the cover 110 that are integral to each other are conveyed from the maintenance table 108 to suction pins 301 of the conveying stage 103 with the mechanism 107, and are held by the suction pins 301. Subsequently, the chuck 101 alone is held by the attaching and detaching mechanism 106 that can be driven up and down such that the chuck 101 is separated from the cover 110. Subsequently, the cover 110 is carried out from above the suction pins 301 with the conveying mechanism 107. Subsequently, the chuck 101 is mounted onto the stage 103 with the attaching and detaching mechanism 106. Note that the conveying mechanism 107 may also be used as a conveying mechanism that conveys the wafer 102. In such a case, since a separate conveying mechanism does not need to be provided, advantageously, the cost of the device can be suppressed. Furthermore, since the conveying mechanism 107 accesses the maintenance table 108 and the stage 103, the conveying mechanism 107 may be configured of a plurality of conveying mechanisms. Moreover, the conveying mechanism may be a conveying mechanism that performs the functions of both the attaching and detaching mechanism 106 and the conveying mechanism 107 with a single mechanism.

As described above, in a state in which there is no foreign substance attached to the back surface of the chuck 101, the cover 110 can be mounted on the chuck 101, and the chuck 101 can be mounted on the stage 103. Accordingly, interposing of foreign substance between the chuck 101 and the stage 103 can be prevented. As a result, effect on the flatness of the wafer mounted on the chuck 101 can be suppressed.

In a case in which the chuck 101 is carried out from above the stage 103, the cover 110 is conveyed from the maintenance table 108 to the vicinity of the stage 103 with the conveying mechanism 107. Subsequently, the chuck 101 is detached from the stage 103 with the attaching and detaching mechanism 106. The cover 110 is conveyed above the suction pins 301 with the conveying mechanism 107, and the chuck. 101 is mounted on the cover 110 with the attaching and detaching mechanism 106. Subsequently, the chuck 101 and the cover 110 that are integral to each other are conveyed to the maintenance table 108 with the conveying mechanism 107. With the above, the chuck 101 can be conveyed to the stage 103 while there is no foreign substance attached to the back surface of the chuck 101. Furthermore, in a case in which the chuck 101 is carried out from above the stage 103 as well, the chuck 101 can be carried out while there is no foreign substance attached to the back surface of the chuck 101.

As described above, by using the cover 110, foreign substances can be removed from the back surface of the chuck 101, and attachment of foreign substances onto the back surface of the chuck 101 can be prevented while the stage 103 is being conveyed.

Accordingly, an effect, caused due to the foreign substance attached on the back surface of the chuck 101, on the flatness of the wafer mounted on the chuck 101 can be suppressed, and the wafer 102 can be held while a high flatness of the wager 102 is maintained.

Second Exemplary Embodiment

Figure 4A:
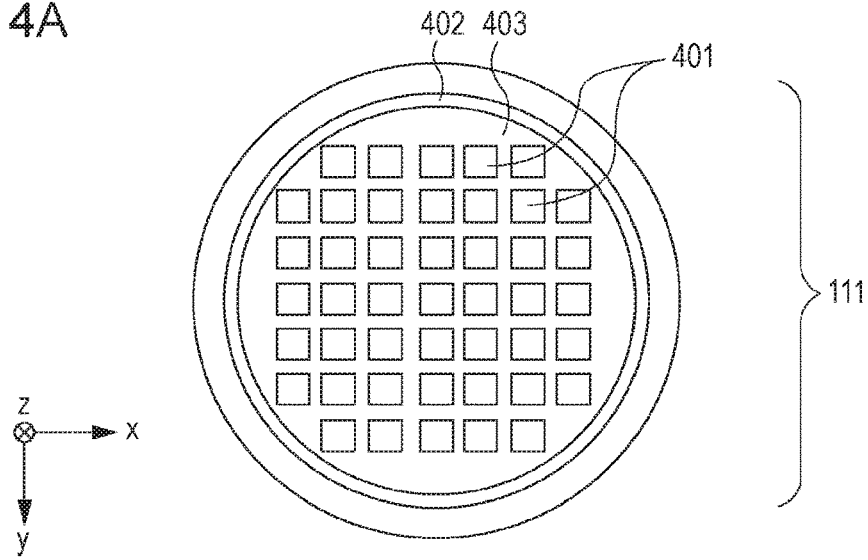
FIGS. 4A to 4C are diagrams exemplifying a cover and the like according to a second exemplary embodiment.
Figure 4B:
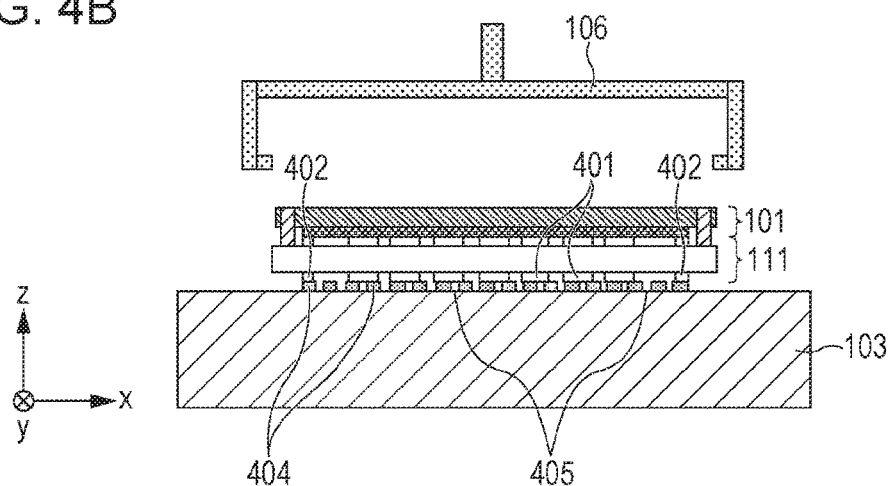
Figure 4C:
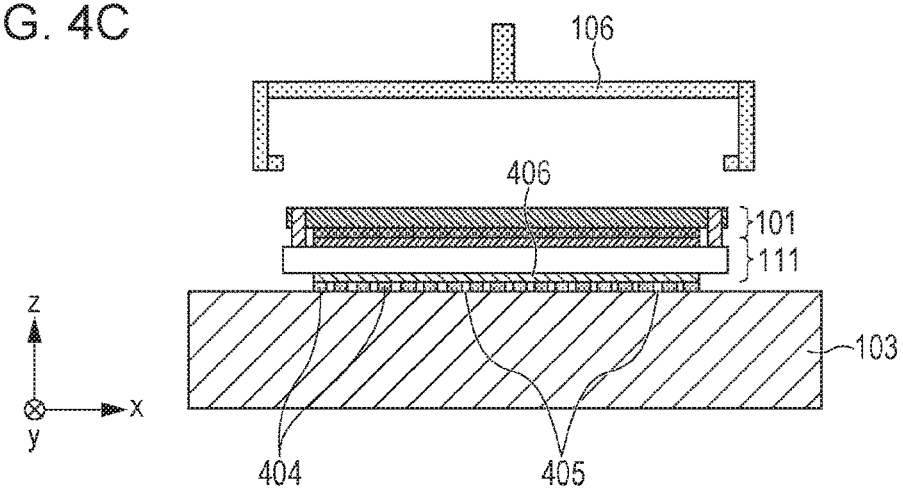

A description of a cover member according to a second exemplary embodiment will be given next. Note that matters that are not described herein may be the same as those described in the first exemplary embodiment. FIGS. 4A to 4C are diagrams exemplifying the cover and the like according to the second exemplary embodiment. The cover 111 according to the present exemplary embodiment will be described with reference to FIGS. 4A, 4B, and 4C. In addition to the features of the cover 110 according to the first exemplary embodiment, the cover 111 includes at least one protrusion 401 and at least one recess 403, serving as a removing member (a second removing member) that removes foreign substance attached on the surface of the stage 103. The protrusion 401 and the recess 403 are included on a back surface of the cover 111. The shape of the protrusion. 401 may be, not only a square illustrated in FIG. 4A, any shape such as a circle, an ellipse, a polygon, or a grid-like shape. Furthermore, at least one annual protrusion 402 may be included. The annular protrusion 402 illustrated in FIG. 4A is a single annular protrusion 402 disposed around the protrusions 401; however, a plurality of annular protrusions with different diameters may be disposed, and annular protrusions may be disposed between the plurality of protrusions 401.

Referring next to FIG. 4B, a method of removing a foreign substance of the chuck 103 with the cover 111 of the present exemplary embodiment will be described. After being conveyed above the suction pins 301 of the stage 103, the cover 111 and the chuck 101 that are integral to each other are held by the attaching and detaching mechanism 106. Protrusions 404 and recesses 405 are included on the front surface of the stage 103. While having the protrusions 404, and the protrusion 401 of the cover 111 and the annular protrusion 402 be in contact with each other, the stage 103 is driven in a horizontal direction, or the stage 103 is fixed and the attaching and detaching mechanism 106 is driven in the horizontal direction. Regarding the driving method, driving may be performed such that the plurality of protrusions 401 of the cover 111 and the end portion of the annular protrusion 402 slide against the entire area of the plurality of protrusions 404, may be performed in a linear manner, or may be performed in a curved manner. With the above, the foreign substance can be removed by having the protrusion 401 of the cover 111 and the end portion of the annular protrusion 402 makes the foreign substance attached to the protrusions 404 of the stage 103 fall into the recesses 405 of the stage 103. The width and the pitch of the protrusions 401 and the width of the annular protrusion 402 may have dimensions allowing the protrusions 401 and the end portion of the annular protrusion 402 to stroke the entire plurality of protrusions 404 of the stage 103 when sliding is performed. Furthermore, the height from the recesses 405 of the stage 103 to the protrusions 404 may be sufficiently high compared with the height of the foreign substance that has dropped into the recess 405.

Furthermore, similar to the method of carrying the chuck. 101 to the stage 103 according to the first exemplary embodiment, the chuck 101 is separated from the cover 111, the cover 111 is carried out, and the chuck 101 is carried to the stage 103.

In a state in which the chuck 101 is not mounted on the stage 103, the protrusions 404 of the stage 103 are exposed; accordingly, foreign substances easily become attached thereto. By removing the foreign substances with the protrusions 404 of the cover 111 of the present exemplary embodiment immediately before mounting the chuck 101 on the stage 103, interposing of foreign substance between the chuck 101 and the stage 103 can be suppressed.

Furthermore, while a method of removing foreign substances by sliding of the protrusion 401 of the cover 111 and the like has been described, as illustrated in FIG. 40, an adhesive 406 serving as a removing member for removing foreign substances attached to the front surface of the protrusions 404 of the stage 103 may be included on the back surface of the cover 111. Foreign substances can be removed by having the adhesive 406 come into contact with and become separated from the front surface of the stage 103. Furthermore, the size of the surface constituting the adhesive 406 may be any size that is larger than the entire surface of the area of the protrusions 404 so as to remove foreign substances from the entire front surface of the protrusions 404 of the stage 103.

Note that in addition to the cover 110 according to the first exemplary embodiment, in a case in which protrusions or the like or an adhesive is included on the back surface of the cover 111 according to the present exemplary embodiment, the combination of the protrusion or the like or the adhesive that is included on the front surface and the back surface of the cover 111 can be of any combination.

Furthermore, after mounting the chuck 101 on the stage 103 and before carrying out the cover 111, foreign substances attached to the surface of the chuck 101 holding the wafer 102 can be removed using the cover 111. In such a case, the foreign substance can be removed by a similar method of removing the foreign substance attached to the stage 103. With the above, interposing of a foreign substance between the wafer 102 and the chuck 101 can be prevented.

As described above, foreign substances can be removed from the front surface of the stage 103 by using the cover 111 according to the present exemplary embodiment.

Accordingly, an effect, caused due to the foreign substance attached on the front surface of the stage 103, on the flatness of the wafer mounted on the chuck 101 can be suppressed, and the wafer 102 can be held while a high flatness of the wager 102 is maintained.

Method of Manufacturing Article

A method of manufacturing, as an article, a device (a semiconductor device, a magnetic storage medium, a liquid crystal display element, and the like), a color filter, or a hard disk, for example, will be described. Such a manufacturing method includes a step of forming a pattern on a substrate (a wafer, a glass plate, a film substrate, and the like) using a lithography apparatus (for example, an exposure apparatus, an imprint device, a drawing apparatus). Such a manufacturing method further includes a step of treating the substrate on which the pattern has been formed. The treating step may include a step of removing the residual film of the pattern. Furthermore, the treating step may include other known steps such as a step of etching the substrate as a mask in which the pattern has been formed. The method for manufacturing an article according to the present exemplary embodiment is, compared with conventional methods, advantageous in at least one of performance, quality, productivity, and manufacturing cost of the article.

While preferable exemplary embodiments of the present disclosure have been described above, it goes without saying that the present disclosure is not limited to the various exemplary embodiments and may be deformed and modified within the scope of the gist of the disclosure. For example, the lithography apparatus is not limited to an exposure apparatus that forms a pattern by exposing a substrate. The lithography apparatus may be an apparatus such as a drawing apparatus that forms a pattern on a substrate by plotting a charged particle beam (an electron beam, an ion beam, or the like) on the substrate through a charged particle optical system. Furthermore, the lithography apparatus may be an imprint apparatus that forms a pattern on a substrate by forming (molding) an imprint material (a resin, etc.) on a substrate with a mold (an original). Furthermore, while the cover member is described as a member that covers the substrate, the cover member may be a member that covers a mold (an original), and the conveying apparatus may be a conveying apparatus that conveys the mold (the original) and the cover member. Furthermore, the cover member, the conveying apparatus, and the lithography apparatus according to the first and second exemplary embodiments may be implemented not only individually but can be implemented as a combination that can be made with the first and second exemplary embodiments.

The present disclosure is capable of providing a cover member, a conveying apparatus, a lithography apparatus, and a method of manufacturing an article that hold a substrate while maintaining a high flatness of the substrate.

While the present disclosure has been described with reference to exemplary embodiments, it is to be understood that the disclosure is not limited to the exemplary embodiments. The scope of the following claims is to be accorded the broadest interpretation so as to encompass all such modifications and equivalent structures and functions.

This application claims the benefit of Japanese Patent Application No. 2016-075990 filed Apr. 5, 2016, which is hereby incorporated by reference herein in its entirety.

What is claimed is:

1. A cover member for covering a first surface on an opposite side with respect to a holding surface of a holding portion that holds a substrate, the cover member comprising:
    a first removing member configured to remove a foreign substance attached to the first surface; and
    a fixing member configured to fix the holding portion in a direction extending along the first surface while the holding portion is movable in a direction perpendicular to the first surface,
    wherein the fixing member is configured to fix the holding portion while the first surface and the first removing member are in contact with each other covering the first surface.

2. The cover member according to claim 1, further comprising:
    a second removing member configured to remove a foreign substance attached to a movable moving unit that holds the holding portion, the second removing member being included on a surface on an opposite side of the surface of the cover member including the first removing member.

3. The cover member according to claim 1, wherein the fixing member is screwed into the cover member.

4. The cover member according to claim 1, wherein a material of the cover member includes ceramics.

5. The cover member according to claim 1, wherein a material of the cover member includes either one of silicon carbide, alumina, silicon nitride, and zircon.

6. The cover member according to claim 1, wherein a size of the first surface of the holding portion is a size that covers a circle having a diameter of 300 mm to 310 mm, or 450 mm to 460 mm, and the thickness of the holding portion is 1 mm to 3 mm.

7. The cover member according to claim 1, wherein the first removing member includes an adhesive.

8. The cover member according to claim 1, wherein the first removing member includes a plurality of protrusions.

9. The cover member according to claim 1, wherein the first removing member includes an annular protrusion.

10. The cover member according to claim 2, wherein the second removing member includes an adhesive.

11. The cover member according to claim 2, wherein the second removing member includes a plurality of protrusions.

12. The cover member according to claim 2, wherein the second removing member includes an annular protrusion.

* * * * *